United States Patent
Wang et al.

(10) Patent No.: US 10,410,687 B2
(45) Date of Patent: Sep. 10, 2019

(54) STATIC MEMORY CELL CAPABLE OF BALANCING BIT LINE LEAKAGE CURRENTS

(71) Applicant: Ningbo University, Zhejiang (CN)

(72) Inventors: Pengjun Wang, Zhejiang (CN); Keji Zhou, Zhejiang (CN); Yuejun Zhang, Zhejiang (CN); Huihong Zhang, Zhejiang (CN)

(73) Assignee: Ningbo University, Zhejiang (CN)

( * ) Notice: Subject to any disclaimer, the term of this patent is extended or adjusted under 35 U.S.C. 154(b) by 0 days.

(21) Appl. No.: 16/108,106

(22) Filed: Aug. 22, 2018

(65) Prior Publication Data
US 2019/0206484 A1 Jul. 4, 2019

(30) Foreign Application Priority Data

Jan. 3, 2018 (CN) .......................... 2018 1 0003439

(51) Int. Cl.
*G11C 5/06* (2006.01)
*G11C 11/419* (2006.01)
(Continued)

(52) U.S. Cl.
CPC ................. *G11C 5/06* (2013.01); *G11C 7/12* (2013.01); *G11C 11/412* (2013.01); *G11C 11/419* (2013.01); *H01L 27/1104* (2013.01)

(58) Field of Classification Search
CPC ....... G11C 5/06; G11C 11/419; G11C 11/412; G11C 7/12; H01L 27/1104
See application file for complete search history.

(56) References Cited

U.S. PATENT DOCUMENTS

| | | | | |
|---|---|---|---|---|
| 8,294,212 B2* | 10/2012 | Wang | ................... | G11C 11/412 257/347 |
| 2006/0239057 A1* | 10/2006 | Muller | .................. | G11C 11/412 365/63 |
| 2016/0163714 A1* | 6/2016 | Mojumder | ............. | G11C 5/063 257/773 |

OTHER PUBLICATIONS

Leland Chang et al., "An 8T-SRAM for Variability Tolerance and Low-Voltage Operation in High-Performance Caches", IEEE Journal of Solid-State Circuits, Apr. 2008, pp. 956-963.
(Continued)

*Primary Examiner* — Ajay Ojha
(74) *Attorney, Agent, or Firm* — JCIPRNET

(57) ABSTRACT

A static memory cell capable of balancing bit line leakage currents is characterized by including a $1^{st}$ PMOS transistor, a $2^{nd}$ PMOS transistor, a $1^{st}$ NMOS transistor, a $2^{nd}$ NMOS transistor, a $3^{rd}$ NMOS transistor, a $4^{th}$ NMOS transistor, a $5^{th}$ NMOS transistor, a $6^{th}$ NMOS transistor, a $7^{th}$ NMOS transistor, an $8^{th}$ NMOS transistor, a write word line, a read word line, a read bit line, an inverted read bit line, a write bit line and an inverted write bit line. The $1^{st}$ NMOS transistor, the $2^{nd}$ NMOS transistor, the $3^{rd}$ NMOS transistor and the $4^{th}$ NMOS transistor are all normal threshold NMOS transistors. The $1^{st}$ PMOS transistor and the $2^{nd}$ PMOS transistor are both low threshold PMOS transistors. The $5^{th}$ NMOS transistor, the $6^{th}$ NMOS transistor, the $7^{th}$ NMOS transistor and the $8^{th}$ NMOS transistor are all low threshold NMOS transistors. The static memory cell has the advantages of high read operation speed, low power consumption and high stability under low operating voltage conditions.

2 Claims, 3 Drawing Sheets

(51) Int. Cl.
    *G11C 7/12*     (2006.01)
    *H01L 27/11*     (2006.01)
    *G11C 11/412*     (2006.01)

(56) References Cited

OTHER PUBLICATIONS

Meng-Fan Chang et al., "A Sub-0.3 V Area-Efficient L-Shaped 7T SRAM With Read Bitline Swing Expansion Schemes Based on Boosted Read-Bitline, Asymmetric-VTH Read-Port, and Offset Cell VDD Biasing Techniques", IEEE Journal of Solid-State Circuits, Aug. 6, 2013, pp. 2558-2569.

* cited by examiner

STATIC MEMORY CELL CAPABLE OF BALANCING BIT LINE LEAKAGE CURRENTS

CROSS-REFERENCE TO RELATED APPLICATION

This application claims the priority benefit of china application serial no. 201810003439.8, filed on Jan. 3, 2018. The entirety of the above-mentioned patent application is hereby incorporated by reference herein and made a part of this specification.

BACKGROUND

Field of the Invention

The invention relates to a static memory cell, in particular to a static memory cell capable of balancing bit line leakage currents.

Description of Related Art

With the development of electronic and portable medical equipment, low power consumption has become one of the primary goals of chip designers. To achieve low power consumption of circuits, the most direct and effective method is to reduce the operating voltage. At present, most power is consumed by memories of chips. Static Random-Access Memory (SRAM) has high performance and is widely adopted for designing chips, and thus an effective method for prolonging the service life of equipment is to lower power consumption of SRAM. However, under the influence of manufacturing process deviations and lower and lower operating voltage (power voltage), the on/off current ratio of SRAM is gradually decreased accordingly, the ratio of the leakage current to the total current is continuously increased, and the stability is sharply reduced due to the increase of the leakage current ratio. In SRAM, static memory cells have the smallest characteristic dimension and occupy most area of the memory, and the improvement of the stability of the static memory cells under low operating voltage conditions will be beneficial for improving the stability of the whole SRAM under the low operating voltage conditions.

At present, SRAM is formed by various types of static memory cells, and static memory cells of the 6T structure are most commonly used in the current industry. When the static memory cells of the 6T structure (6T cells) are not selected, the memory node and the bit line of SRAM are connected through a closed transistor. Therefore, the leakage current generated between the bit line and the node when data 0 is stored will be different from the leakage current generated between the bit line and the node when data 1 is stored. Under an extreme low voltage condition where the bit line is loaded with a large number of static memory cells (for instance, all the static memory cells store 1 or 0), the leakage current difference will be extremely obvious, and the leakage current even can exceed the normal read current. In Article *An 8T-SRAM for variability tolerance and low-voltage operation in high-performance caches*, IBM put forwards a static memory cell of an 8T structure (8T cell), which adopts a decoupling structure and isolates read path from memory nodes to improve noise tolerance; however, the problem of poor stability caused by leakage current changes on the read path is still not solved, and the read operation speed is modest. A static memory cell of a 7T structure (7T cell) is put forwards in Article *A Sub-0.3 V Area-Efficient L-Shaped 7T SRAM With Read Bitline Swing Expansion Schemes Based on Boosted Read-Bitline, Asymmetric-V Read-Port, and Offset Cell VDD Biasing Techniques*. In the static memory cell of the 7T structure, a bit line and a word line are connected through a single transistor, thereby being high in read operation speed; however, although the bit line leakage current can be kept extremely low as the word line is kept at a high level in continuous operation, leakage current changes can still be caused by voltage changes of the gate.

For this reason, it is of important significance to design a static memory cell capable of balancing bit line leakage currents, which is high in read operation speed, low in power consumption and high instability under low operating voltage conditions.

SUMMARY

The technical issue to be settled by the invention is to provide a static memory cell capable of balancing bit line leakage currents, which is high in read operation speed, low in power consumption and high instability under low operating voltage conditions.

Technical solutions used by the invention to settle aforesaid technical issue are stated as follows: A static memory cell capable of balancing bit line leakage currents comprises a $1^{st}$ PMOS transistor, a $2^{nd}$ PMOS transistor, a $1^{st}$ NMOS transistor, a $2^{nd}$ NMOS transistor, a $3^{rd}$ NMOS transistor, a $4^{th}$ NMOS transistor, a $5^{th}$ NMOS transistor, a $6^{th}$ NMOS transistor, a $7^{th}$ NMOS transistor, an $8^{th}$ NMOS transistor, a write word line, a read word line, a read bit line, an inverted read bit line, a write bit line and an inverted write bit line. The source of the $1^{st}$ PMOS transistor, the source of the $2^{nd}$ PMOS transistor, the drain of the $6^{th}$ NMOS transistor and the drain of the $8^{th}$ NMOS transistor are connected, and the connecting terminal is the power terminal of the static memory cell. The power terminal of the static memory cell is to be accessed to a power voltage. The gate of the $1^{st}$ PMOS transistor, the gate of the $1^{st}$ NMOS transistor, the drain of the $2^{nd}$ PMOS transistor, the drain of the $2^{nd}$ NMOS transistor, the drain of the $4^{th}$ NMOS transistor, the gate of the $5^{th}$ NMOS transistor and the gate of the $8^{th}$ NMOS transistor are connected, and the connecting terminal is the inverted output terminal of the static memory cell. The drain of the $1^{st}$ PMOS transistor, the drain of the $1^{st}$ NMOS transistor, the gate of the $2^{nd}$ PMOS transistor, the gate of the $2^{nd}$ NMOS transistor, the drain of the $3^{rd}$ NMOS transistor, the gate of the $7^{th}$ NMOS transistor and the gate of the $6^{th}$ NMOS transistor are connected, and the connecting terminal is the output terminal of the static memory cell. The source of the $1^{st}$ NMOS transistor and the source of the $2^{nd}$ NMOS transistor are both grounded. The gate of the $3^{rd}$ NMOS transistor and the gate of the $4^{th}$ NMOS transistor are connected to the write word line. The source of the $3^{rd}$ NMOS transistor is connected to the write bit line. The source of the $4^{th}$ NMOS transistor is connected to the inverted write bit line. The drain of the $5^{th}$ NMOS transistor and the source of the $6^{th}$ NMOS transistor are connected to the inverted read bit line. The source of the $5^{th}$ NMOS transistor and the source of the $7^{th}$ NMOS transistor are connected to the read word line. The drain of the $7^{th}$ NMOS transistor and the source of the $8^{th}$ NMOS transistor are connected to the read bit line. The $1^{st}$ NMOS transistor, the $2^{nd}$ NMOS transistor, the $3^{rd}$ NMOS transistor and the $4^{th}$ NMOS transistor are all normal threshold NMOS transistors. The $1^{st}$ PMOS transistor and the $2^{nd}$ PMOS transistor are both low threshold PMOS transistors. The 5$^{th}$ NMOS transistor, the 6$^{th}$ NMOS transistor, the 7$^{th}$ NMOS transistor and the 8$^{th}$ NMOS transistor are all low threshold NMOS transistors.

The power voltage is 0.3 V. In this structure, the power voltage can be as low as 0.3 V, and thus power consumption is greatly reduced.

Compared with the prior art, the invention has the following advantages: The static memory cell capable of balancing bit line leakage currents is composed of the 1$^{st}$ PMOS transistor, the 2$^{nd}$ PMOS transistor, the 1$^{st}$ NMOS transistor, the 2$^{nd}$ NMOS transistor, the 3$^{rd}$ NMOS transistor, the 4$^{th}$ NMOS transistor, the 5$^{th}$ NMOS transistor, the 6$^{th}$ NMOS transistor, the 7$^{th}$ NMOS transistor, the 8$^{th}$ NMOS transistor, the write word line, the read word line, the read bit line, the inverted read bit line, the write bit line and the inverted write bit line; in write operation, the write bit line WBL and the inverted write bit line WBLB are separately set to the power voltage VDD and the ground VSS according to write information, the read word line RWL and the write word line WWL are set to high levels at the same time, so that the 3$^{rd}$ NMOS transistor N3 and the 4$^{th}$ NMOS transistor N4 are opened, and at this moment, data can be written into the static memory cell by controlling the level state of the write bit line. When data 0 is stored in the static memory cell and data 1 needs to be written into the static memory cell, the output terminal Q of the static memory cell is charged by the 3$^{rd}$ NMOS transistor N3, and the inverted output terminal QB of the static memory cell discharges through the 4$^{th}$ NMOS transistor N4; as the high voltage transmission capacity of the NMOS transistors is poor and the transmission performance of the PMOS transistors is sharply reduced under low power voltage conditions, the output terminal Q of the static memory cell is charged by the 1$^{st}$ low threshold PMOS transistor P1 with higher current to shorten the time for the 3$^{rd}$ NMOS transistor to increase the level of the output terminal Q of the static memory cell, which reduces write operation delay and increases the write speed of the static memory cell. In read operation, the read word line RWL and the write word line WWL are both set to the ground VSS, the 3$^{rd}$ NMOS transistor N3 and the 4$^{th}$ NMOS transistor N4 are closed at this moment, and thus data in the static memory cell is separated from an external write bit line; when data 1 is stored in the static memory cell, the 6$^{th}$ NMOS transistor N6 and the 7$^{th}$ NMOS transistor N7 are opened, the 5$^{th}$ NMOS transistor N5 and the 8$^{th}$ NMOS transistor N8 are closed, and the read bit line RBL discharges through the 7$^{th}$ NMOS transistor N7; and when the read bit line RBL discharges to a certain extent, discharging is completed, at this moment, the read word line RWL is charged to a high level, and low threshold transistors are adopted by the 5$^{th}$ low threshold NMOS transistor N5, the 6$^{th}$ low threshold NMOS transistor, the 7$^{th}$ low threshold NMOS transistor and the 8$^{th}$ NMOS transistor N8 to accelerate read operation and reduce delay. In the static memory cell of the invention, the source of the 6$^{th}$ NMOS transistor is connected to the inverted read bit line, and the source of the 8$^{th}$ NMOS transistor is connected to the read bit line; when the read word line RWL is at a high level, either the gate of the 7$^{th}$ NMOS transistor or the gate of the 8$^{th}$ NMOS transistor is definitely at a high level, and the other is at a low level; similarly, either the gate of the 5$^{th}$ NMOS transistor or the gate of the 6$^{th}$ NMOS transistor is definitely at a high level, the other is at a low level, and at this moment, the source of the 6$^{th}$ NMOS transistor and the source of the 8$^{th}$ NMOS transistor are connected to a high level; and in this case, no matter what data is stored in the static memory cell, leakage currents on the bit lines will not change even if different data is stored in the static memory cell, and thus the stability under low power consumption conditions is ensured. Therefore, the static memory cell of the invention is high in read operation speed, low in power consumption and high in stability under low operating voltage conditions.

DESCRIPTION OF THE EMBODIMENTS

The invention is further described as follows in combination with drawings and embodiments.

Figure 1:
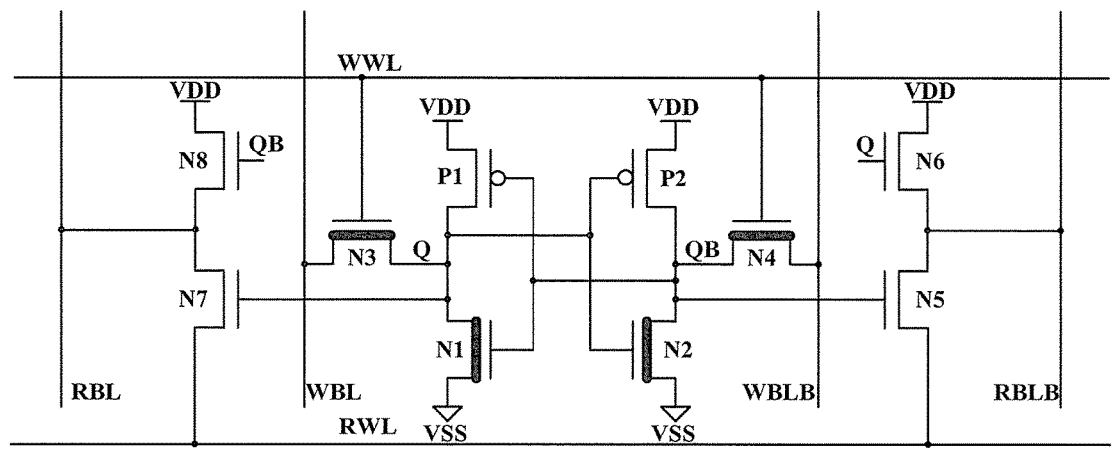
FIG. 1 is a circuit diagram of the static memory cell capable of balancing bit line leakage currents of the invention.
Figure 2:
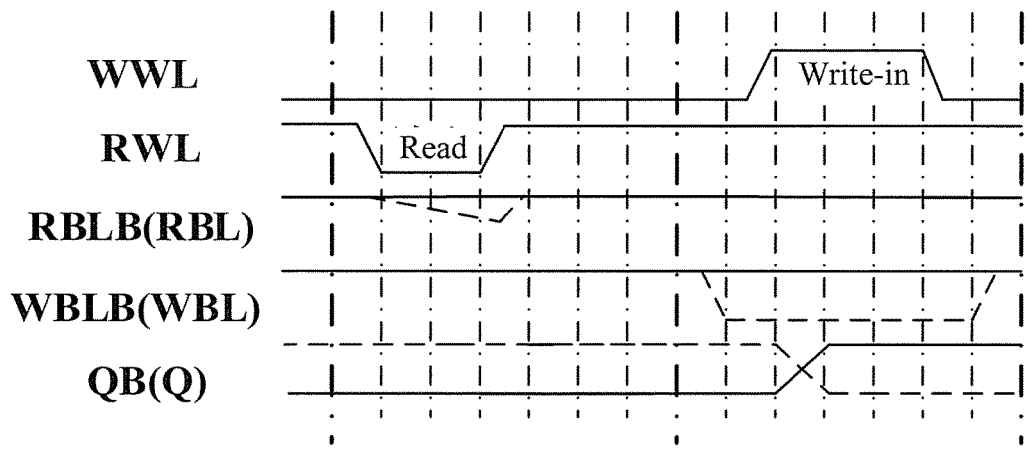
FIG. 2 is a read-write oscillogram of the static memory cell capable of balancing bit line leakage currents of the invention.

First Embodiment: As is shown in FIG. 1, a static memory cell capable of balancing bit line leakage currents comprises a 1$^{st}$ PMOS transistor P1, a 2$^{nd}$ PMOS transistor P2, a 1$^{st}$ NMOS transistor N1, a 2$^{nd}$ NMOS transistor N2, a 3$^{rd}$ NMOS transistor N3, a 4$^{th}$ NMOS transistor N4, a 5$^{th}$ NMOS transistor N5, a 6$^{th}$ NMOS transistor N6, a 7$^{th}$ NMOS transistor N7, an 8$^{th}$ NMOS transistor N8, a write word line WWL, a read word line RWL, a read bit line RBL, an inverted read bit line RBLB, a write bit line WBL and an inverted write bit line WBLB. The source of the 1$^{st}$ PMOS transistor P1, the source of the 2$^{nd}$ PMOS transistor P2, the drain of the 6$^{th}$ NMOS transistor N6 and the drain of the 8$^{th}$ NMOS transistor N8 are connected, the connecting terminal is the power terminal of the static memory cell, and the power terminal of the static memory cell is to be accessed to a power voltage VDD. The gate of the 1$^{st}$ PMOS transistor P1, the gate of the 1$^{st}$ NMOS transistor N1, the drain of the 2$^{nd}$ PMOS transistor P2, the drain of the 2$^{nd}$ NMOS transistor N2, the drain of the 4$^{th}$ NMOS transistor N4, the gate of the 5$^{th}$ NMOS transistor N5 and the gate of the 8$^{th}$ NMOS transistor N8 are connected, and the connecting terminal is the inverted output terminal of the static memory cell. The drain of the 1$^{st}$ PMOS transistor P1, the drain of the 1$^{st}$ NMOS transistor N1, the gate of the 2$^{nd}$ PMOS transistor P2, the gate of the 2$^{nd}$ NMOS transistor N2, the drain of the 3$^{rd}$ NMOS transistor N3, the gate of the 7$^{th}$ NMOS transistor N7 and the gate of the 6$^{th}$ NMOS transistor N6 are connected, and the connecting terminal is the output terminal of the static memory cell. The source of the 1$^{st}$ NMOS transistor N1 and the source of the 2$^{nd}$ NMOS transistor N2 are both grounded. The gate of the 3$^{rd}$ NMOS transistor N3 and the gate of the 4$^{th}$ NMOS transistor N4 are connected to the write word line WWL. The source of the 3$^{rd}$ NMOS transistor N3 is connected to the write bit line WBL. The source of the 4$^{th}$ NMOS transistor N4 is connected to the inverted write bit line WBLB. The drain of the 5$^{th}$ NMOS transistor N5 and the source of the 6$^{th}$ NMOS transistor N6 are connected to the inverted read bit line RBLB. The source of the 5$^{th}$ NMOS transistor N5 and the source of the 7$^{th}$ NMOS transistor N7 are connected to the read word line RWL. The drain of the 7$^{th}$ NMOS transistor N7 and the source of the 8$^{th}$ NMOS transistor N8 are connected to the read bit line RBL. The 1$^{st}$ NMOS transistor N1, the 2$^{nd}$ NMOS transistor N2, the 3$^{rd}$ NMOS transistor N3 and the 4$^{th}$ NMOS transistor N4 are all normal threshold NMOS transistors. The 1$^{st}$ PMOS transistor P1 and the 2$^{nd}$ PMOS transistor P2 are both low threshold PMOS transistors. The 5$^{th}$ NMOS transistor N5, 6$^{th}$ NMOS transistor N6, the 7$^{th}$ NMOS transistor N7 and the 8$^{th}$ NMOS transistor N8 are all low threshold NMOS transistors.

Second Embodiment: As is shown in FIG. 1, a static memory cell capable of balancing bit line leakage currents comprises a 1$^{st}$ PMOS transistor P1, a 2$^{nd}$ PMOS transistor P2, a 1$^{st}$ NMOS transistor N1, a 2$^{nd}$ NMOS transistor N2, a 3$^{rd}$ NMOS transistor N3, a 4$^{th}$ NMOS transistor N4, a 5$^{th}$ NMOS transistor N5, a 6$^{th}$ NMOS transistor N6, a 7$^{th}$ NMOS transistor N7, an 8$^{th}$ NMOS transistor N8, a write word line WWL, a read word line RWL, a read bit line RBL, an inverted read bit line RBLB, a write bit line WBL and an inverted write bit line WBLB. The source of the 1$^{st}$ PMOS transistor P1, the source of the 2$^{nd}$ PMOS transistor P2, the drain of the 6$^{th}$ NMOS transistor N6 and the drain of the 8$^{th}$ NMOS transistor N8 are connected, the connecting terminal is the power terminal of the static memory cell, and the power terminal of the static memory cell is to be accessed to a power voltage VDD. The gate of the 1$^{st}$ PMOS transistor P1, the gate of the 1$^{st}$ NMOS transistor N1, the drain of the 2$^{nd}$ PMOS transistor P2, the drain of the 2$^{nd}$ NMOS transistor N2, the drain of the 4$^{th}$ NMOS transistor N4, the gate of the 5$^{th}$ NMOS transistor N5 and the gate of the 8$^{th}$ NMOS transistor N8 are connected, and the connecting terminal is the inverted output terminal of the static memory cell. The drain of the 1$^{st}$ PMOS transistor P1, the drain of the 1$^{st}$ NMOS transistor N1, the gate of the 2$^{nd}$ PMOS transistor P2, the gate of the 2$^{nd}$ NMOS transistor N2, the drain of the 3$^{rd}$ NMOS transistor N3, the gate of the 7$^{th}$ NMOS transistor N7 and the gate of the 6$^{th}$ NMOS transistor N6 are connected, and the connecting terminal is the output terminal of the static memory cell. The source of the 1$^{st}$ NMOS transistor N1 and the source of the 2$^{nd}$ NMOS transistor N2 are both grounded. The gate of the 3$^{rd}$ NMOS transistor N3 and the gate of the 4$^{th}$ NMOS transistor N4 are connected to the write word line WWL. The source of the 3$^{rd}$ NMOS transistor N3 is connected to the write bit line WBL. The source of the 4$^{th}$ NMOS transistor N4 is connected to the inverted write bit line WBLB. The drain of the 5$^{th}$ NMOS transistor N5 and the source of the 6$^{th}$ NMOS transistor N6 are connected to the inverted read bit line RBLB. The source of the 5$^{th}$ NMOS transistor N5 and the source of the 7$^{th}$ NMOS transistor N7 are connected to the read word line RWL. The drain of the 7$^{th}$ NMOS transistor N7 and the source of the 8$^{th}$ NMOS transistor N8 are connected to the read bit line RBL. The 1$^{st}$ NMOS transistor N1, the 2$^{nd}$ NMOS transistor N2, the 3$^{rd}$ NMOS transistor N3 and the 4$^{th}$ NMOS transistor N4 are all normal threshold NMOS transistors. The 1$^{st}$ PMOS transistor P1 and the 2$^{nd}$ PMOS transistor P2 are both low threshold PMOS transistors. The 5$^{th}$ NMOS transistor N5, the 6$^{th}$ NMOS transistor N6, the 7$^{th}$ NMOS transistor N7 and the 8$^{th}$ NMOS transistor N8 are all low threshold NMOS transistors.

In this embodiment, the power voltage VDD is 0.3 V.

Under the condition that the power voltage VDD is 0.3 V, the static memory cell of the invention is simulated and compared with a 6T cell, a 7T cell and an 8T cell. In the simulation process, the read operation is simulated under the condition that one bit line is loaded with 128 static memory cells. According to extracted parasitic parameters, the capacitance of the read bit line is about 23 fF. To quantify the delay of each static memory cell, the read delay is defined from the extent that the read word line turns by 50% to the extent that the read bit line drops by 100 mV. The read delay comparative data of the static memory cell of the invention with the 6T cell, the 7T cell and the 8T cell is shown in Table 1. To better compare advantages and disadvantages, except the 6T cell, both the 7T cell and the 8T cell are designed with low threshold transistors.

TABLE 1

Read delay comparison of cells

| VDD = 300 mV | 6T cell | 7T cell | 8T cell | The invention |
|---|---|---|---|---|
| The shortest read delay (ns) | 425.8 | 28.63 | 51.75 | 41.2 |
| The longest read delay (ns) | 455.2 | 31.61 | 56.11 | 41.2 |

As can be seen from analysis on Table 1, the 7T cell has the highest read speed. The invention adopts an extra transistor to balance the influence of leakage currents, thereby having a read speed slightly lower than that of the 7T cell. Compared with the 6T cell adopting normal threshold transistors, the read speed of the invention is increased by about 933.5%. Compared with the 8T cell adopting low threshold transistors, the read speed of the invention is increased by about 20.4%. The read speed the 6T cell adopting normal threshold transistors is about 10 times lower than that of the invention.

It is noted that the different transistors in the static memory cell may have different transistors with a high threshold voltage ("Hvt" hereinafter), a low threshold voltage ("Lvt" hereinafter) and/or a regular threshold voltage (Rvt). Hence the threshold voltage of each of the transistors may be varied in terms of devices with different process technologies which include, different gate oxide thickness is heavily-doped with p+n+ implants or lightly-doped p-/n- implants, and so on. In the circuit design, the transistor with a high threshold (Hvt) is a device having the characteristics of turning on slowly, having less leakage current, and/or having lower power consumption. The transistor with the high threshold (Hvt) may be achieved by, for example, a heavily doping process. The transistor with a low threshold (Lvt) is a device having the characteristics of turning on quickly, having large leakage current, and/or having higher power consumption. The transistor with the low threshold (Lvt) may be achieved by a lightly doping process. The transistors with a regular threshold voltage (Rvt) may be also defined, in the disclosure, as a normal threshold transistor, which has a threshold voltage between the aforesaid high threshold voltage and the low threshold voltage. The normal threshold transistor is the transistor with a standard threshold voltage ("Svt" hereinafter). The normal threshold transistors have the characteristics of turning on with a medium time quicker than the high threshold transistor and slower than the low threshold transistors, having a medium leakage current higher than high threshold transistor and/or lesser than the low threshold transistor, and having a medium power consumption higher than the high threshold transistor and lesser than the low threshold transistor. The threshold voltages may vary with different process technology.

Figure 3:
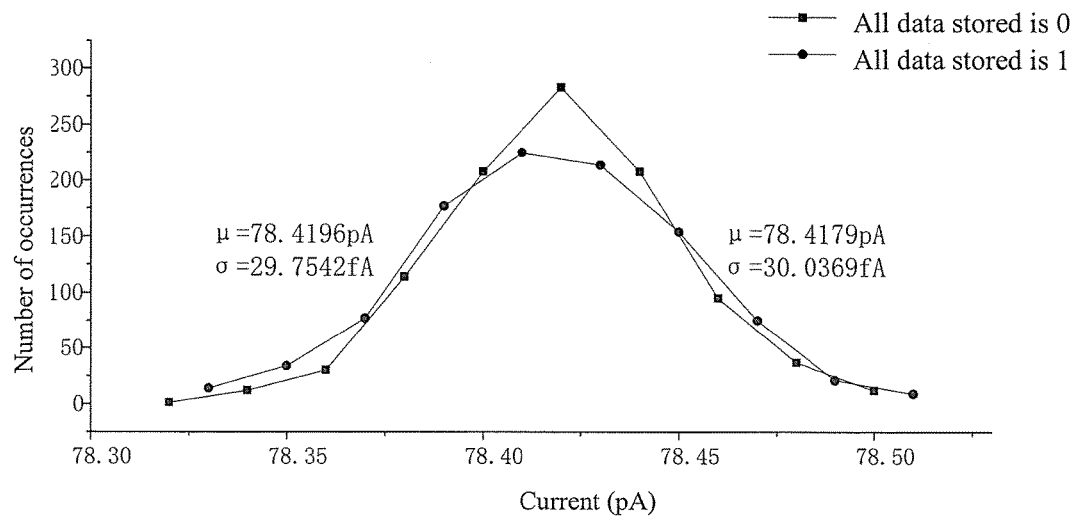
FIG. 3 is a leakage current distribution diagram of the invention under the power voltage of 300 mV.
Figure 4:
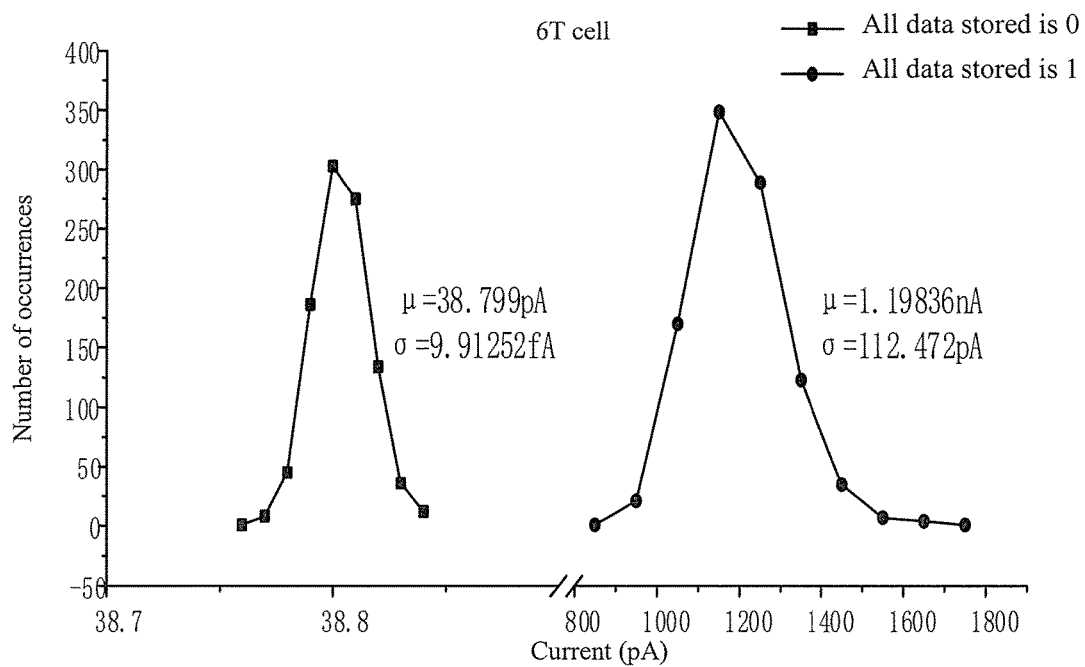
FIG. 4 is a leakage current distribution diagram of a 6T cell under the power voltage of 300 mV.
Figure 5:
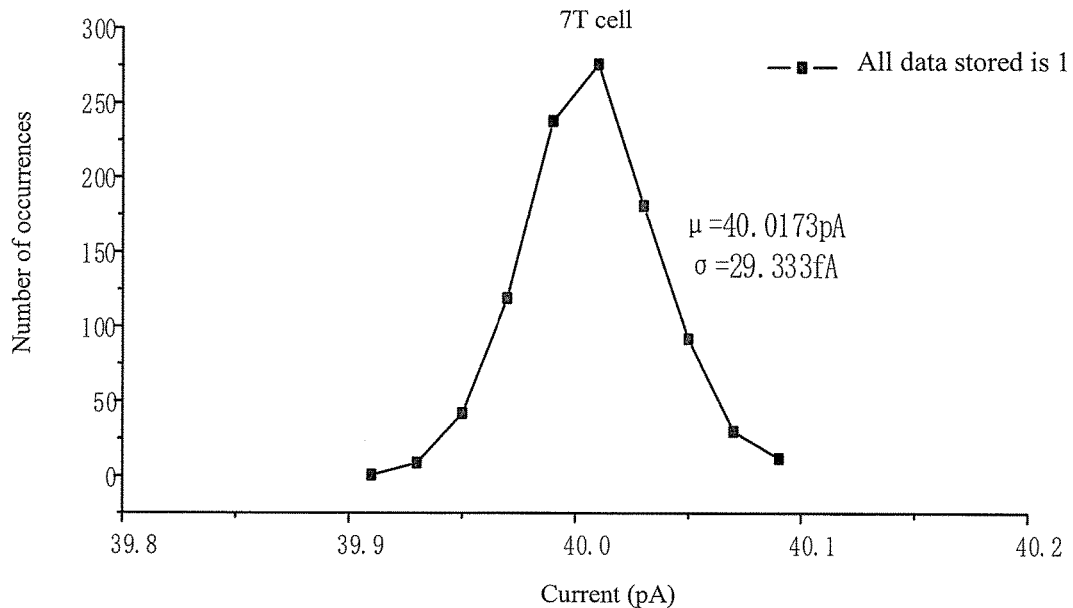
FIG. 5 is a leakage current distribution diagram of a 7T cell under the power voltage of 300 mV.
Figure 6:
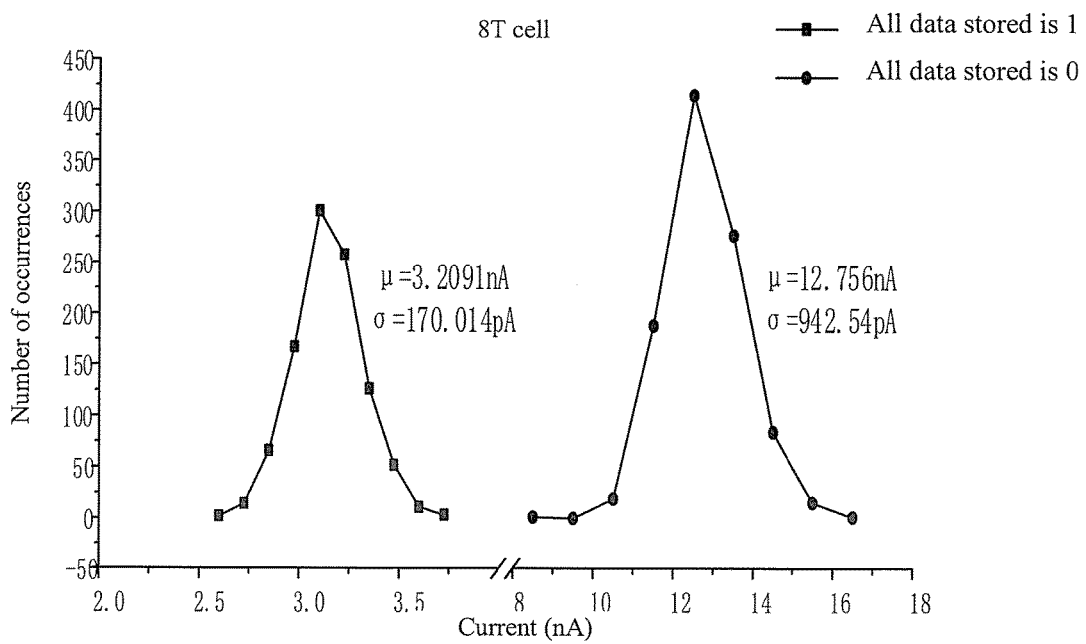
FIG. 6 is a leakage current distribution diagram of an 8T cell under the power voltage of 300 mV.

Even though the path between the read bit line and the non-selected static memory cell is closed in read operation, little leakage current is still generated. Particularly when the static memory cell operates in the sub-threshold region, the operating time is prolonged, and thus the influence of leakage currents is more obvious. In addition, the leakage currents change when difference data is stored. In read operation, these differences will cause a voltage drop to different degrees. Under extreme conditions, the leakage currents even exceed the normal read current after the bit lines are loaded with multiple cells. To compare the influences of the leakage currents under low voltage conditions in read operation, the leakage currents of the invention, the 6T cell, the 7T cell and the 8T cell are compared through Monte-Carlo simulation, and each circuit is simulated 1000 times. Under the power voltage of 300 mV, the leakage current distribution diagram of the invention is shown in FIG. 3. Under the power voltage of 300 mV, the leakage current distribution diagram of the 6T cell is shown in FIG. 4. Under the power voltage of 300 mV, the leakage current distribution diagram of the 7T cell is shown in FIG. 5. Under the power voltage of 300 mV, the leakage current distribution diagram of the 8T cell is shown in FIG. 6. As can be seen from analysis on FIG. 6, when data 1 is stored in the 8T cell, the ground VSS and the read bit line are separated through two transistors; and on the contrary, when data 0 is stored in the 8T cell, the inverted output terminal QB is at a high level, which means that the ground VSS and the read bit line are separated by only one transistor. Therefore, the maximum leakage current of a memory array formed by 8T cells appears under the condition that all data stored is 0, and the minimum leakage current appears under the condition that all data stored is 1. Other cells are simulated based on the same principle, and data is shown in Table 2.

TABLE 2

Bit line leakage current comparison of cells

| VDD = 300 mV | 6T | 7T | 8T | The invention |
|---|---|---|---|---|
| Maximum leakage current average value μ (nA) | 1.19836 | 0.0400173 | 12.756 | 0.0784196 |
| Maximum leakage current standard difference σ (pA) | 112.472 | 0.029333 | 942.54 | 0.0297542 |
| Minimum leakage current average value μ (nA) | 0.038799 | 0.03884 | 3.2091 | 0.0784179 |
| Minimum leakage current standard difference σ (pA) | 0.00991252 | 0 | 170.014 | 0.0300369 |
| Leakage current difference | 96.76% | 2.94% | 74.84% | 0.0022% |

The leakage current difference refers to the ratio of the difference between the maximum leakage current value and the minimum leakage current value to the maximum leakage current value. As can be seen from analysis on Table 2, the 6T cell has the greatest leakage current difference of all the leakage current differences. The invention is capable of balancing leakage currents, thereby having the same leakage current when storing different data; and moreover, the read word line of the invention is kept at a high level in idle time, and thus bit line leakage currents can be effectively reduced.

In conclusion, the invention adopts a single low threshold transistor to accelerate read operation. Compared with the normal threshold 6T cell, the read speed of the invention is increased by 933.5% under the power voltage of 0.3 V. Compared with the low threshold 8T cell, the read speed of the invention is increased by 20.4% under the power voltage of 0.3 V. In addition, the read path design strategy for balancing leakage currents is adopted, so that compared with the 7T cell with a small difference, the leakage current difference of the invention is reduced by three levels, and the yield of the memory cell and the corresponding SRAM is increased.

What is claimed is:

1. A static memory cell capable of balancing bit line leakage currents, characterized in that comprises
a $1^{st}$ PMOS transistor;
a $2^{nd}$ PMOS transistor;
a $1^{st}$ NMOS transistor;
a $2^{nd}$ NMOS transistor;
a $3^{rd}$ NMOS transistor;
a $4^{th}$ NMOS transistor;
a $5^{th}$ NMOS transistor;
a $6^{th}$ NMOS transistor;
a $7^{th}$ NMOS transistor;
an $8^{th}$ NMOS transistor;
a write word line;
a read word line;
a read bit line;
an inverted read bit line;
a write bit line; and
an inverted write bit line,
wherein a source terminal of the $1^{st}$ PMOS transistor, a source terminal of the $2^{nd}$ PMOS transistor, a drain terminal of the $6^{th}$ NMOS transistor and a drain terminal of the $8^{th}$ NMOS transistor are connected to a power terminal of the static memory cell, wherein the power terminal of the static memory cell is to be accessed to a power voltage,
wherein a gate terminal of the $1^{st}$ PMOS transistor, a gate terminal of the $1^{st}$ NMOS transistor, a drain terminal of the $2^{nd}$ PMOS transistor, a drain terminal of the $2^{nd}$ NMOS transistor, a drain terminal of the $4^{th}$ NMOS transistor, a gate terminal of the $5^{th}$ NMOS transistor and a gate terminal of the $8^{th}$ NMOS transistor are connected to an inverted output terminal of the static memory cell,
wherein a drain terminal of the $1^{st}$ PMOS transistor, a drain terminal of the $1^{st}$ NMOS transistor, a gate terminal of the $2^{nd}$ PMOS transistor, a gate terminal of the $2^{nd}$ NMOS transistor, a drain terminal of the $3^{rd}$ NMOS transistor, a gate terminal of the $7^{th}$ NMOS transistor and gate terminal of the $6^{th}$ NMOS transistor are connected to an output terminal of the static memory cell,
wherein a source terminal of the $1^{st}$ NMOS transistor and a source terminal of the $2^{nd}$ NMOS transistor are both ground voltage,
wherein a gate terminal of the $3^{rd}$ NMOS transistor and a gate terminal of the $4^{th}$ NMOS transistor are connected to the write word line,
wherein a source terminal of the $3^{rd}$ NMOS transistor is connected to the write bit line, and a source terminal of the $4^{th}$ NMOS transistor is connected to the inverted write bit line,
wherein a drain terminal of the $5^{th}$ NMOS transistor and a source terminal of the $6^{th}$ NMOS transistor are connected to the inverted read bit line,
wherein a source of the $5^{th}$ NMOS transistor and a source terminal of the $7^{th}$ NMOS transistor are connected to the read word line,
wherein a drain terminal of the $7^{th}$ NMOS transistor and a terminal source of the $8^{th}$ NMOS transistor are connected to the read bit line, wherein the 1$^{st}$ NMOS transistor, the 2$^{nd}$ NMOS transistor, the 3$^{rd}$ NMOS transistor and the 4$^{th}$ NMOS transistor are all normal threshold NMOS transistors, wherein the 1$^{st}$ PMOS transistor and the 2$^{rd}$ PMOS transistor are both low threshold PMOS transistors. The 5$^{th}$ NMOS transistor, the 6$^{th}$ NMOS transistor, the 7$^{th}$ NMOS transistor and the 8$^{th}$ NMOS transistor are all low threshold NMOS transistors.

2. A static memory cell capable of balancing bit line leakage currents according to claim 1, characterized in that the power voltage is 0.3 V.

* * * * *